(12) United States Patent
Fattaruso

(10) Patent No.: US 7,777,531 B2
(45) Date of Patent: Aug. 17, 2010

(54) LOW POWER LOW VOLTAGE DIFFERENTIAL SIGNALING (LVDS) OUTPUT DRIVERS

(75) Inventor: John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 140 days.

(21) Appl. No.: 12/106,046

(22) Filed: Apr. 18, 2008

(65) Prior Publication Data

US 2009/0108882 A1 Apr. 30, 2009

Related U.S. Application Data

(60) Provisional application No. 60/983,863, filed on Oct. 30, 2007.

(51) Int. Cl.
*H03K 5/22* (2006.01)

(52) U.S. Cl. .............................. 327/65; 327/67; 330/258

(58) Field of Classification Search .................... 327/65, 327/67; 330/258
See application file for complete search history.

(56) References Cited

U.S. PATENT DOCUMENTS 6,130,548 A 10/2000 Koifman
6,388,522 B1 * 5/2002 Fattaruso et al. ............ 330/258
6,590,422 B1 7/2003 Dillon
6,791,377 B2 9/2004 Ilchmann et al.
6,847,232 B2 1/2005 Tinsley et al.
7,135,894 B1 * 11/2006 Stegers et al. ............... 327/108
2004/0124918 A1 7/2004 Radelinow

FOREIGN PATENT DOCUMENTS

JP 2003273672 9/2006

* cited by examiner

*Primary Examiner*—Lincoln Donovan
*Assistant Examiner*—John W Poos
(74) *Attorney, Agent, or Firm*—John J. Patti; Wade J. Brady, III; Frederick J. Telecky, Jr.

(57) ABSTRACT

A method and apparatus for providing a low power low voltage differential signaling driver are disclosed. In an example, a low voltage differential signaling driver circuit is described, comprising a first current source to provide current to a first differential pair of PNP transistors, a pair of transresistance amplifiers driven by a corresponding pair of transconductance stages, a second current source to provide current to a second differential pair of PNP transistors, and an output port having a common mode output voltage and a differential output voltage based on a state of the first differential pair of PNP transistors and the second differential pair of PNP transistors.

22 Claims, 5 Drawing Sheets

LOW POWER LOW VOLTAGE DIFFERENTIAL SIGNALING (LVDS) OUTPUT DRIVERS

RELATED APPLICATIONS

This patent claims priority from U.S. patent application Ser. No. 60/983,863, which was filed on Oct. 30, 2007, and is hereby incorporated by reference in its entirety.

FIELD OF THE DISCLOSURE

This disclosure relates generally to differential signaling and, more particularly, to low power low voltage differential signaling output drivers.

BACKGROUND

Low voltage differential signaling (LVDS) is an electrical signaling system that communicates information (i.e., digital bits) using two conductors, typically twisted-pair wires, having between them a common-mode voltage and a differential voltage. The differential voltage between the wires is used to encode the information in bits. To transmit a signal, a transmitting side injects a small current into one of the conductors depending on the logic level, which travels to a receiving side, through a resistor, and back to the transmitter. A receiver measures the voltage across the resistor and determines the information from the polarity of the voltage. By repeatedly switching the polarity of the voltage differential at the load, signals are transmitted to the receiver. Thus, faster switching capability results in higher communication speeds.

SUMMARY

An embodiment of the present invention, accordingly, provides a low voltage differential signaling driver circuit. The circuit comprises a first differential pair of PNP transistors; a pair of transconductances stages; a second differential pair of PNP transistors that is coupled to the pair of transconductances stages; a first current source that is coupled to the first differential pair to provide current to the first differential pair; a second current source that is coupled to the second differential pair to provide current to the second differential pair; a pair of transresistance amplifiers that is coupled to the first differential pair and that is driven by the pair of transconductance stages; and an output port having a common mode output voltage and a differential output voltage, wherein each of the common mode output voltage and the differential output voltage is based on a state of the first differential pair and the second differential pair.

In accordance with another embodiment of the present invention, a differential input that inputs a differential voltage to the first and second differential pairs is provided.

In accordance with another embodiment of the present invention, a bias input to control the current sources is provided.

In accordance with another embodiment of the present invention, a common mode feedback block to control the common mode output voltage is provided.

In accordance with another embodiment of the present invention, the second current source and the second differential pair drive the transconductance stages.

In accordance with another embodiment of the present invention, the transresistance amplifier comprises an NPN bipolar transistor with feedback from a base to a collector provided by a resistor.

In accordance with another embodiment of the present invention, the circuit further comprising transistors to conduct current into the transconductance stages to provide short-circuit protection.

In accordance with another embodiment of the present invention, a method to provide low voltage differential signaling is provided. The method comprises increasing current flowing through a first differential transistor; decreasing current flowing through a second differential transistor; decreasing current flowing through a first transconductance stage to increase current flowing through a first transresistance amplifier; increasing current flowing through a second transconductance stage to decrease current flowing through a second transresistance amplifier; and transmitting a differential output signal by controlling one of the first or second differential transistor and one of the first or second transresistance amplifier.

In accordance with another embodiment of the present invention, the method further comprises increasing the current flowing through at least one of the first transconductance stage or the second transconductance stage to decrease the current flowing through at least one of the first transresistance amplifier or the second transresistance amplifier in response to a short-circuit.

In accordance with another embodiment of the present invention, the method further comprises adjusting a common mode output voltage via a common mode feedback block.

In accordance with another embodiment of the present invention, a low voltage differential signaling driver circuit is provided. The circuit comprises a differential input; a bias input; a differential output; a first differential pair of PNP bipolar transistors, wherein each of the PNP transistors of the first differential pair is coupled to the differential input, and wherein the first differential pair is coupled to the differential output; a second differential pair of PNP bipolar transistors, wherein each of the PNP transistors of the second differential pair is coupled to the differential input; a first PNP current source coupled to the first differential pair; a second PNP current source coupled to the second differential pair; a pair of transresistance amplifiers coupled to the first differential pair, wherein the pair of transresistance amplifiers having local resistive feedback; a pair of current mirrors coupled the second differential pair to control the transresistance amplifiers; a common mode feedback block coupled between at least one of the current mirrors and the differential output.

In accordance with another embodiment of the present invention, the second differential pair controls currents in the current mirrors.

In accordance with another embodiment of the present invention, the differential input controls the first and second differential pairs.

In accordance with another embodiment of the present invention, the differential output is based on the pair of transresistance amplifiers and the first differential pair.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION

Certain examples are shown in the above-identified figures and described in detail below. In describing these examples, like or identical reference numbers may be used to identify common or similar elements. The figures are not necessarily to scale and certain features and certain views of the figures may be shown exaggerated in scale or in schematic for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof.

Additionally, it is contemplated that any form of logic may be used to implement portions of apparatus or methods herein. Logic may include, for example, circuit implementations that are made exclusively in dedicated hardware (e.g., circuits, transistors, logic gates, hard-coded processors, programmable array logic (PAL), application-specific integrated circuits (ASICs), etc.), exclusively in software, exclusively in firmware, or some combination of hardware, firmware, and/or software. Accordingly, while the following describes example methods and apparatus, persons of ordinary skill in the art will readily appreciate that the examples are not the only way to implement such apparatus.

The example methods and apparatus described herein may be used to provide a low power low voltage differential signaling (LVDS) output driver utilizing a complementary bipolar process. An example circuit includes a first current source, a first differential pair of PNP transistors, a pair of transresistance amplifiers driven by a corresponding pair of transconductance stages, which are in turn coupled to a second current source and a second pair of differential PNP transistors. The example circuit also includes an example common mode feedback block to maintain a constant common mode output voltage via a pair of current sources.

Figure 1:
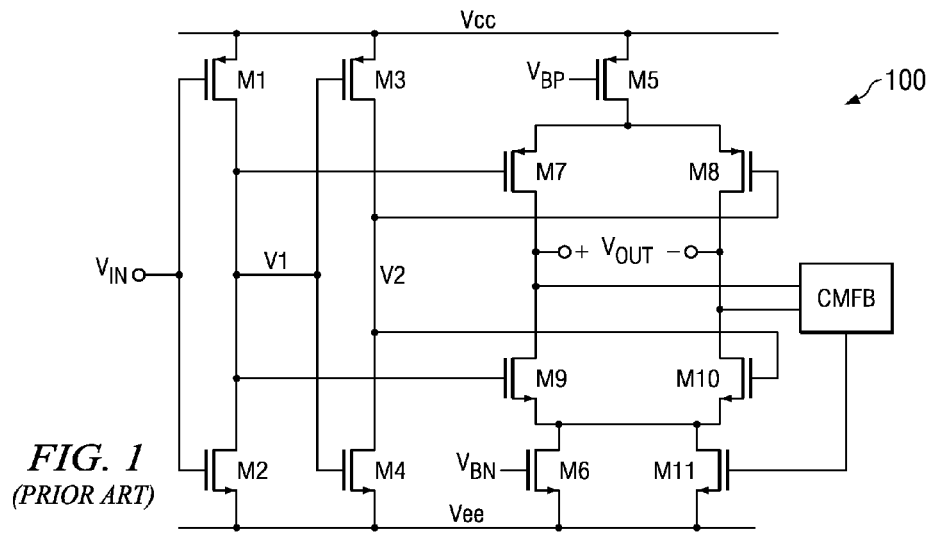
FIG. 1 is a schematic diagram of a known LVDS output driver utilizing CMOS technology.

FIG. 1 is a schematic diagram of a known LVDS output driver 100 utilizing complementary metal-oxide-semiconductor (CMOS) technology. An input signal ($V_{IN}$) is coupled to two inverting logic gates (M1 and M2, and M3 and M4), which respectively generate a logic level opposite that of $V_{IN}$ (V1) and a logic level the same as $V_{IN}$ (V2). Two current sources, which are implemented using metal-oxide-semiconductor field effect transistors (MOSFETs) M5 and M6, establish an output current based on respective bias voltages $V_{bp}$ and $V_{bn}$. The current is diverted to one of the output terminals $V_{out}+$ or $V_{out}-$ based on the polarity of $V_{IN}$. An output stage having two complementary pairs of MOSFETs M7, M8, M9 and M10, which are turned on (i.e., conducting more current) and off (i.e., conducting less current) based on V1 and V2, respectively. The complementary pair of MOSFETs M7 and M9 is controlled by V1 (i.e., the inverse of $V_{IN}$), such that M7 and M9 may not both be on at the same time. Similarly, the MOSFETs M8 and M10 are controlled by V2, such that M8 and M10 may not both be on at the same time. A common mode feedback block (CMFB) maintains a desired common mode voltage at the $V_{out}$ terminals via the MOSFET M11. A power supply (Vcc) and a ground reference (Vcc) supply power to the LVDS output driver 100.

Figure 2:
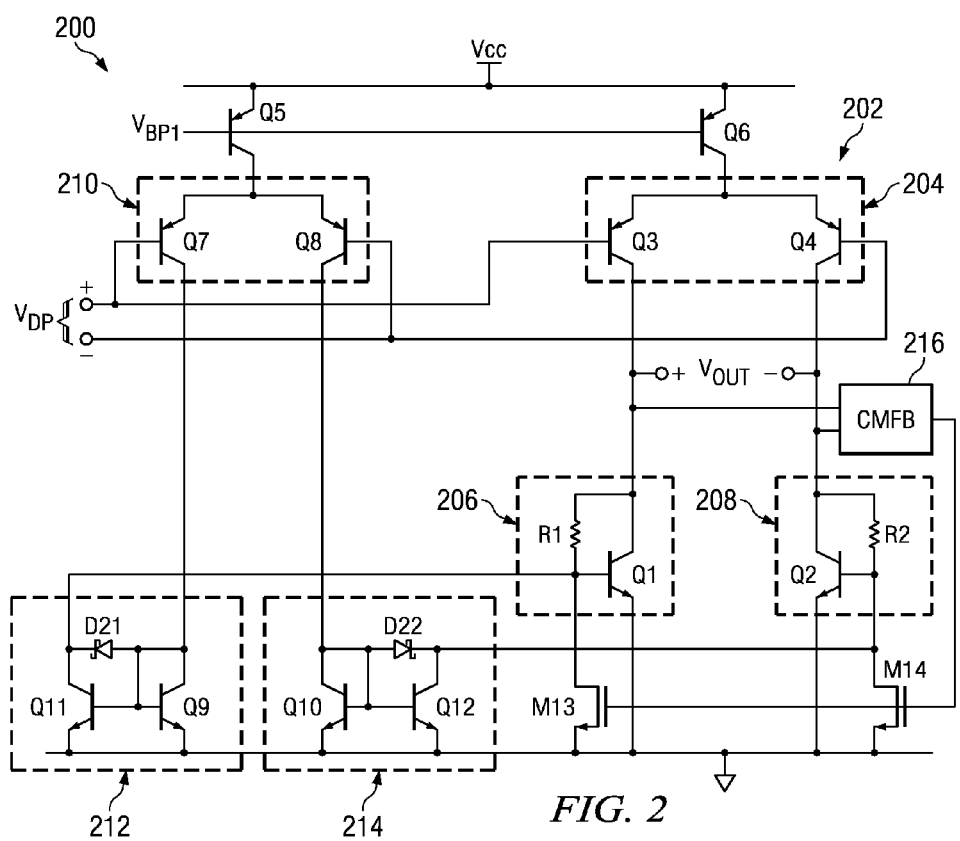
FIG. 2 is a schematic diagram of an example low power LVDS output driver.

FIG. 2 is a schematic diagram of an example low power LVDS output driver 200. The example driver 200 receives a differential input VDP and transmits a differential output $V_{out}$ over two output terminals $V_{out}+$ and $V_{out}-$ to transmit data. A first current source Q6 supplies a first output current to be redirected to one of $V_{out}+$ or $V_{out}-$ via an output stage 202. The output current returns via the opposite output terminal $V_{out}+$ or $V_{out}-$ and flows through the remaining portion of the output stage 202. The direction of current flow through $V_{out}$ is determined by $V_{DP}$, and in turn determines the signal received at the load (not shown).

The example output stage 202 includes a differential pair 204 of PNP bipolar transistors Q3 and Q4 and a pair of transresistance amplifiers 206 and 208. The example transresistance amplifiers 206 and 208 utilize NPN bipolar transistors Q1 and Q2, each having local resistive feedback from a base to a collector provided by resistors R1 and R2, respectively. The local feedback establishes a relatively low output impedance at $V_{out}$, which helps the circuit drive high edge rates into capacitive loads and establish desired output voltage levels. In one example, the resistors R1 and R2 each have a value of 1600 ohms. Summing nodes at the bases of Q1 and Q2 have low input impedance, thereby providing immunity to parasitic wiring capacitance. Finally, the local feedback configuration avoids operating the NPN bipolar transistors Q1 and Q2 in the saturation region.

A second current source Q5 supplies a second current to a second pair 210 of differential PNP bipolar transistors Q7 and Q8. The transistors Q7 and Q8 each control current to respective transconductance stages 212 and 214, which act as current sinks to control the transresistance amplifiers 206 and 208, respectively. The example transconductance stages 212 and 214 are implemented using current mirrors. The transconductance stage (i.e.,current mirror) 212 has an NPN bipolar transistor Q9, which has a current based on Q7, and a second NPN bipolar transistor Q1, which has a current equal or substantially equal to the current in Q9. Likewise, the transconductance stage (i.e.,current mirror) 214 includes an NPN bipolar transistor Q10 having a current based on Q8 and an NPN bipolar transistor Q12 having an equal or substantially equal current. In the example of FIG. 2, the current mirrors 212 and 214 each have a Schottky diode D21 and D22, respectively, to assist the transistors Q11 and Q12 in avoiding operating in saturation as described below.

The first current source Q6 and the second current source Q5 are shown as PNP bipolar transistors Q6 and Q5, respectively. A bias input $V_{BP1}$ controls the current provided by Q5 and Q6. $V_{BP1}$ is provided by an external current mirror. However, $V_{BP1}$ may be provided by any voltage or current source to control the current sources Q5 and Q6.

A CMFB 216 is coupled to the terminals of $V_{out}$ to monitor and control the common mode voltage. The CMFB 216 controls the currents drawn out of the summing nodes (i.e., base terminals) of Q1 and Q2 by controlling gate voltages of NMOS transistors M13 and M14. In one example, the bias points of Q1 and Q2 are maintained at the same or substantially the same common mode voltage (i.e., ignoring any differential voltage) as described below. By increasing and decreasing the current drawn from the summing nodes of Q1 and Q2, the common mode voltage of $V_{out}$ is controlled.

A voltage source Vcc supplies the output driver 200 with power, which is used to drive signals via the output terminal $V_{out}$. In the example output driver 200, Vcc has a typical integrated circuit supply voltage of 3.3V. Of course, other voltages may be used.

The differential input $V_{DP}$ controls the differential pairs 204 and 210 of PNP transistors Q3, Q4 and Q7, Q8. For ease of reference, the terminals of $V_{DP}$ have been marked as a $V_{DP}+$ terminal and a $V_{DP}-$ terminal corresponding to the differential output terminals described below in connection with FIG. 3. The $V_{DP}+$ terminal controls the base terminals (and, therefore, the currents) of Q3 and Q7, and the $V_{DP}-$ terminal controls the base terminals of Q4 and Q8. Additionally, this example discussion will refer to the transistors as "on" or "off" to reflect the logical nature of digital signals, although in practice all transistors may be partially on (i.e., operating in the active mode) due to the common mode voltage and/or current. In the active mode, transistors conduct more or less current depending on the input to the transistor instead of turning fully on or fully off.

We now turn to an example of the LVDS output driver 200 in operation. The bias voltage $V_{BP1}$ provides a constant or substantially constant voltage to the current sources Q5 and Q6, which permit currents to flow depending on respective emitter areas of each current source. In the example LVDS output driver 200, Q5 conducts approximately 0.125 mA and Q6 conducts approximately 3.5 mA (i.e., the LVDS standard). In this example description, $V_{DP}+$ has a voltage at logic high and $V_{DP}-$ has a voltage at logic low. $V_{DP}+$ has a current flowing into the output driver 200 and $V_{DP}-$ has a current flowing out of the output driver 200.

The current from $V_{DP}+$ turns off Q3 and Q7, causing them to restrict current flowing therethrough. The restricted current through Q7 restricts the current available to flow through Q9 and, therefore, Q11. The lack of current flowing through Q11 causes the voltage at the base of Q1 (i.e., the collector of Q11) to rise. This causes Q1 to turn on and conduct current returning from the terminal $V_{out}+$ to ground.

The low signal from $V_{DP}-$ turns on Q4 and Q8, causing them to allow more current through. As Q8 conducts more current, this current flows through Q10 and, as a result, an equal or substantially equal current flows through Q12. As a result, the voltage at the base of Q2 drops and Q2 shuts off. The current flowing through Q4 continues to a load via the terminal $V_{out}-$.

The foregoing operational example allows the output driver 200 to transmit a signal corresponding to $V_{DP}+$ at logic high and $V_{DP}-$ at logic low. A current flows from Vcc to $V_{out}$ via Q3 and Q4, which directs the current to the terminal $V_{out}-$ and a first conductor of transmission line (not shown). The current eventually reaches a termination resistor or load and returns via a transmission line through the $V_{out}+$ terminal and Q1 to ground. To determine a symbol at the termination resistor, a receiver circuit (not shown) detects the polarity of the voltage across the terminals of the termination resistor.

An additional operational example may be shown in the case where $V_{out}+$ is at logic low and $V_{out}-$ is at logic high. In this example, Q2 and Q3 turn on (via current sink 214) while Q1 and Q4 turn off, causing current to flow from $V_{out}+$ to $V_{out}-$ and resulting in a signal of the opposite polarity at the receiver.

The operational examples described above utilize standard LVDS output voltages shown in Table 1, which defines the output voltage range for $V_{out}$.

TABLE 1

| Parameter | Nominal | Minimum | Maximum |
|---|---|---|---|
| VOL | 1.075 V | 0.950 V | |
| VOH | 1.425 V | | 1.600 V |
| VCMO | 1.250 V | 1.125 V | 1.375 V |

The parameters VOL and VOH define the voltages at $V_{out}+$ when transmitting logic low and logic high, respectively. The parameter $C_{CMO}$, the common mode output voltage, is the average voltage of $V_{out}+$ and $V_{out}-$ with respect to ground at any given moment during circuit operation. The LVDS standard output voltages in combination with a 3.3V voltage source allow the PNP transistors to avoid the saturation region and the accompanying decrease in switching speed.

The Schottky diodes D21 and D22 prevent Q11 and Q12, respectively, from falling into the saturation region. For example, if the output voltage maximum is limited by the PNP drive current through one of Q3 or Q4 into the termination load resistance instead of being limited by the transresistance amplifier 206, then the transresistance amplifier 206 (i.e., the NPN Q1) becomes cut off and the feedback current through R1 is not sufficient to keep Q11 out of saturation. The diode D21 absorbs enough drive current from Q7 to keep Q11 at the edge of saturation, which keeps the switching speed from being significantly degraded.

The transistors Q3 and Q4 of the example output driver 200 may be built larger than the other transistors in the output driver 200 and, as a result, may have a larger conduction channel. The larger channel may accommodate larger currents flowing through $V_{out}$. However, a larger channel may cause a capacitive load on the input driver 300 described below in connection with FIG. 3.

Figure 3:
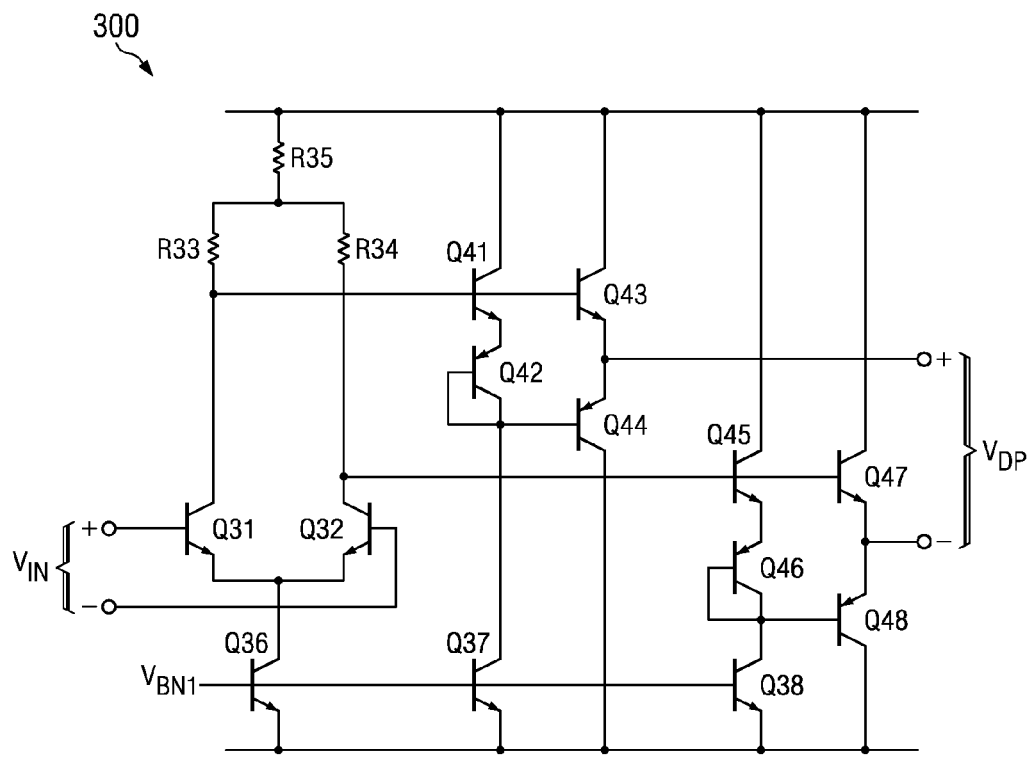
FIG. 3 is a schematic diagram of an example input stage for the example low power LVDS output driver.

FIG. 3 is a schematic diagram of an example input stage 300 coupled to the example low power LVDS output driver 200. The input stage 300 may be classified as a class AB complementary emitter-follower due to the operation of the circuit. The input stage has a differential input voltage $V_{IN}$ to control a differential pair of NPN transistors Q31 and Q32. A bias input $V_{bn1}$ controls three NPN current sources Q36, Q37 and Q38 to conduct a desired current through Q31 and Q32, as well as complementary bipolar transistors Q41 and Q42, and Q45 and Q46. Resistors R33-R35 set a voltage range to control the bases of the complementary bipolar transistors. Additional complementary bipolar transistors Q43 and Q44, and Q47 and Q48 are also controlled in conjunction with Q41-Q42, and Q45-Q46 to provide an appropriate output to the output driver 200 via $V_{DP}$.

Turning to an operational example, $V_{IN}$ provides a differential input signal as noted in FIG. 3, wherein the base of Q31 has a voltage higher than a common mode voltage and the base of Q32 has a voltage lower than the common mode voltage. $V_{IN}$ causes Q31 to increase conduction of current, which lowers the voltage at the collector, and Q32 to decrease conduction of current, which increases the voltage at the collector. The higher voltage is the input to Q41 and, in the diode-connected configuration shown, also to Q42. The current source Q37 causes a constant or substantially constant current through Q41 and Q42 and produces constant or substantially constant base-emitter voltages in Q41 and Q42.

Therefore, the output of Q31 controls the bases of complementary bipolar transistors Q43 and Q44 via Q41 and Q42 as shown.

As the voltage at the bases of Q43 and Q44 decrease, Q43 decreases conduction and Q44 increases conduction, which lowers the voltage at the $V_{DP}+$ terminal. In the same way, because the voltage at the collector of Q32 (i.e., the bases of Q47 and Q48) increases, Q47 increases conduction and Q48 decreases conduction, which increases the voltage at the $V_{DP}-$ terminal. It is noted that the terminal polarity for $V_{IN}$ and $V_{DP}$ results in a 180° phase shift between the input and output of the input stage 300.

The example input stage 300 has a low output impedance to the example output driver 200, which allows it to source sufficient current to a capacitive load (e.g., Q3 and Q4) with sufficient switching speed. Therefore, any input stage with sufficiently low output impedance may be used in place of the example input stage 300.

Figure 4:
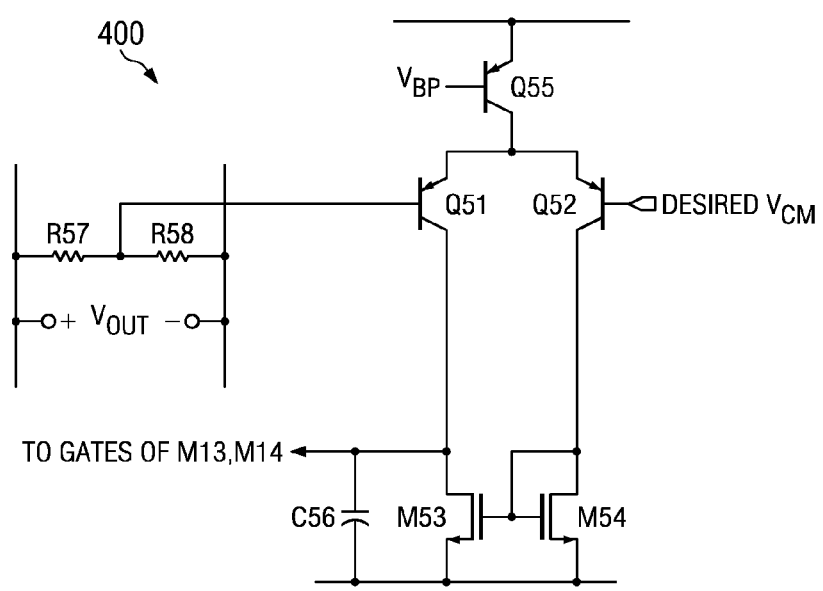
FIG. 4 is a schematic diagram of an example common mode feedback block for the example low power LVDS output driver.

FIG. 4 is a schematic diagram of an example CMFB 400 for the example low power LVDS output driver 200. The example CMFB 400 may be used to implement the CMFB 216 described in FIG. 2. The purpose of a CMFB is to maintain the common mode voltage of the output $V_{out}$. The example CMFB 400 includes resistors R57 and R58 to couple the output $V_{out}$ to an input terminal of a differential pair of PNP transistors Q51 and Q52 (e.g., the base of Q51). The resistance values of R57 and R58 are equal or substantially equal to achieve the average voltage of $V_{out}+$ and $V_{out}-$. If the resistance values of R57 and R58 are not equal, the CMFB 400 may incorrectly adjust the common mode voltage. The resistances should also be high enough to avoid creating additional loading on the output driver 200, but low enough to drive Q51.

A current source, implemented as a PNP transistor Q55, is controlled by a bias signal $V_{bp}$ (e.g., the same bias signal $V_{bp}$ controlling Q5 and Q6 of FIG. 2). A differential pair of PNP transistors Q51 and Q52 is controlled by inputs to control the current in a current mirror utilizing PMOS M53 and M54. The desired common mode voltage $V_{CM}$ is used as the input to Q52, which permits a constant or substantially constant current to flow. The current then flows through M54, causing M53 to draw the same or substantially the same current. As a result, the voltage at the source of M53, supplying the gates of M13 and M14 of FIG. 2, rises or drops based on whether the common mode voltage is higher or lower than $C_{CM}$. A capacitor C56 damps any voltage changes to prevent the common mode voltage from rapidly fluctuating, and promotes general stability of the CMFB 400.

In an example case, the desired common mode voltage is achieved at the base of Q51 by averaging the voltages at $V_{out}+$ and $V_{out}-$. As a result, Q51 and Q52 permit equal currents to flow and the equal currents also flow through M53 and M54, respectively. As the gate voltages to M13 and M14 had already been set to achieve $C_{CM}$ at $V_{out}$, no change in the gate voltage occurs.

In a second example case, the common mode voltage is higher than $C_{CM}$. Due to the higher voltage at the base of Q51 relative to Q52, Q51 conducts less current. However, M53 continues to draw the same current as M54, which causes additional current to be drawn from C56, M13 and/or M14 as well as an accompanying voltage drop. This voltage drop at the gates of M13 and M14 causes a reduction in current flow through M13 and M14, which, in turn, reduces the current flowing from the summing nodes of the transresistance amplifiers 302 and 304. Due to the low input impedance of the transresistance amplifiers 302 and 304, the voltage at the summing nodes will change very little. The reduced current flowing through M13 and M14 results in less current flowing through R1 and R2, respectively, causing a reduced voltage drop at R1 and R2 and lowering $C_{CM}$. Therefore, the high (relative to $C_{CM}$) common mode voltage results in a drop of the common mode voltage via the CMFB 400. Similarly, a low common mode voltage results in a rise in the common mode voltage.

Figure 5:
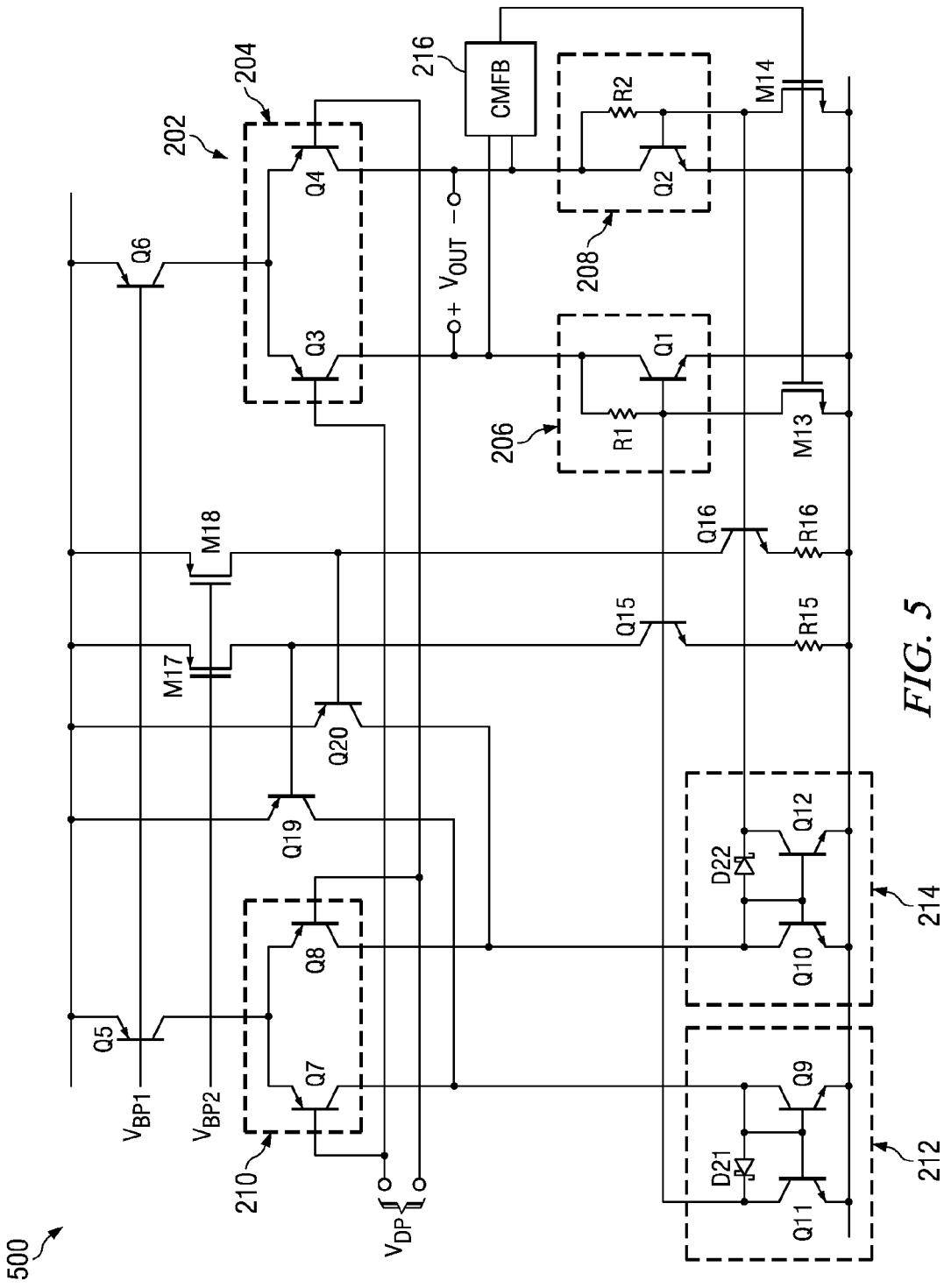
FIG. 5 is a schematic diagram of an example low power LVDS output driver with short circuit protection.

FIG. 5 is a schematic diagram of an example low power LVDS output driver 500 with short-circuit protection. The example low power LVDS output driver 500 operates in a similar fashion as the LVDS output driver 200 described in FIG. 2, with identical components maintaining identical references. In particular, bipolar transistors Q1-Q12, resistors R1-R2, MOS transistors M13-M14, and Schottky diodes D21 and D22 have the same functions as the counterpart components in FIG. 2.

The LVDS output driver 200 shown in FIG. 2 does not have short-circuit protection inherent to the output drivers 100 and 200. If the PNP Q6 of FIG. 2 fails, Q3 and Q4 are short-circuited directly to Vcc and large currents may flow, possibly causing device failure, but this scenario may be rare in a manufactured and tested IC. Another scenario that may result in dangerous current densities can occur when testing an IC including the example circuits described, where a testing probe accidentally makes contact between the Vcc terminal (or other power source) and one of the $V_{out}$ terminals. To protect the example LVDS output driver 500 in case of such events, the LVDS output driver 500 includes bipolar transistors Q15-Q16 and Q19-20, MOS transistors M17-M18 and resistors R15-R16 to provide short-circuit protection. A second bias voltage $V_{BP2}$ controls the current through M17 and M18.

The bipolar transistors Q15 and Q16 are relatively small devices, which monitor the base-emitter junction voltage of Q1 and Q2, respectively. If the junction voltages begin to rise to levels corresponding to dangerous current densities, then the degeneration of resistors R15 and/or R16 will be overcome and enough collector current will be induced in Q15 and/or Q16 to bring current sources M17 and M18 out of operating in the ohmic region. Additionally, Q19 and/or Q20 will begin to conduct current into the current sinks Q9 and/or Q10 (and, via the current mirror, Q11 and/or Q12), turning off Q1 and/or Q2.

The devices Q15-Q16 and Q19-Q20 are small to present a minimal capacitive load to the input stage 300 and to draw little power under normal operating conditions. M17 and M18 are typically held in the ohmic region with very little current flow, and Q19 and Q20 are held cut off.

Although the example output stage 500 includes a particular short-circuit protection device, any appropriate short-circuit protection may be used. Alternatively, the short-circuit protection device may be omitted from the circuit altogether.

The example circuit components Q1-Q12, Q15-Q16, Q19-Q20, Q31-Q32, Q36-Q38, Q41-Q48, Q51-Q52, Q55, M13-M14, M17-M18, M53-M54, R1-R57-58, C56, and D21-D22 of the low power LVDS output driver 200, input stage 300, CMFB 400, and LVDS output driver 500 are each implemented as part of a larger integrated circuit utilizing a monolithic complementary bipolar process. However, any or all of the circuit components Q1-Q12, Q15-Q16, Q19-Q20, Q31-Q32, Q36-Q38, Q41-Q48, Q51-Q52, Q55, M13-M14, M17-M18, M53-M54, R1-R2, R33-R35, and D21-D22 may be implemented using discrete components, integrated circuits, or some combination thereof.

Although the current sources described in FIGS. 2-5 are implemented using PNP transistors Q5-Q6, and Q55, NPN transistors Q36-Q38, and PMOS transistors M17-M18, any or all of the current sources may be implemented using any other type of current source.

The example transresistance amplifiers 206 and 208 of FIGS. 2 and 5 are implemented utilizing NPN transistors Q1 and Q2, respectively, each having local resistive feedback between the base and collector terminals. The local resistive feedback of the illustrated example is provided by large value resistors R1 and R2, respectively. The transresistance amplifiers 206 and/or 208 may be implemented using any appropriate transresistance amplifier to output a voltage in response to a corresponding input current.

The example transconductance stages 212 and 214 are implemented using current mirrors to sink current from a load in response to an input voltage. Additionally, the example transconductance stages have wideband amplification, permitting high switching speeds, and Schottky diodes to prevent the switching speed of the transresistance amplifiers 206 and 208 from degrading. The transconductance stages 212 and/or 214 may be implemented utilizing any appropriate circuit to sink current proportionally in response to an input voltage level having sufficient switching speed to avoid reducing the performance of the output driver(s) 200 and/or 500.

Figure 6:
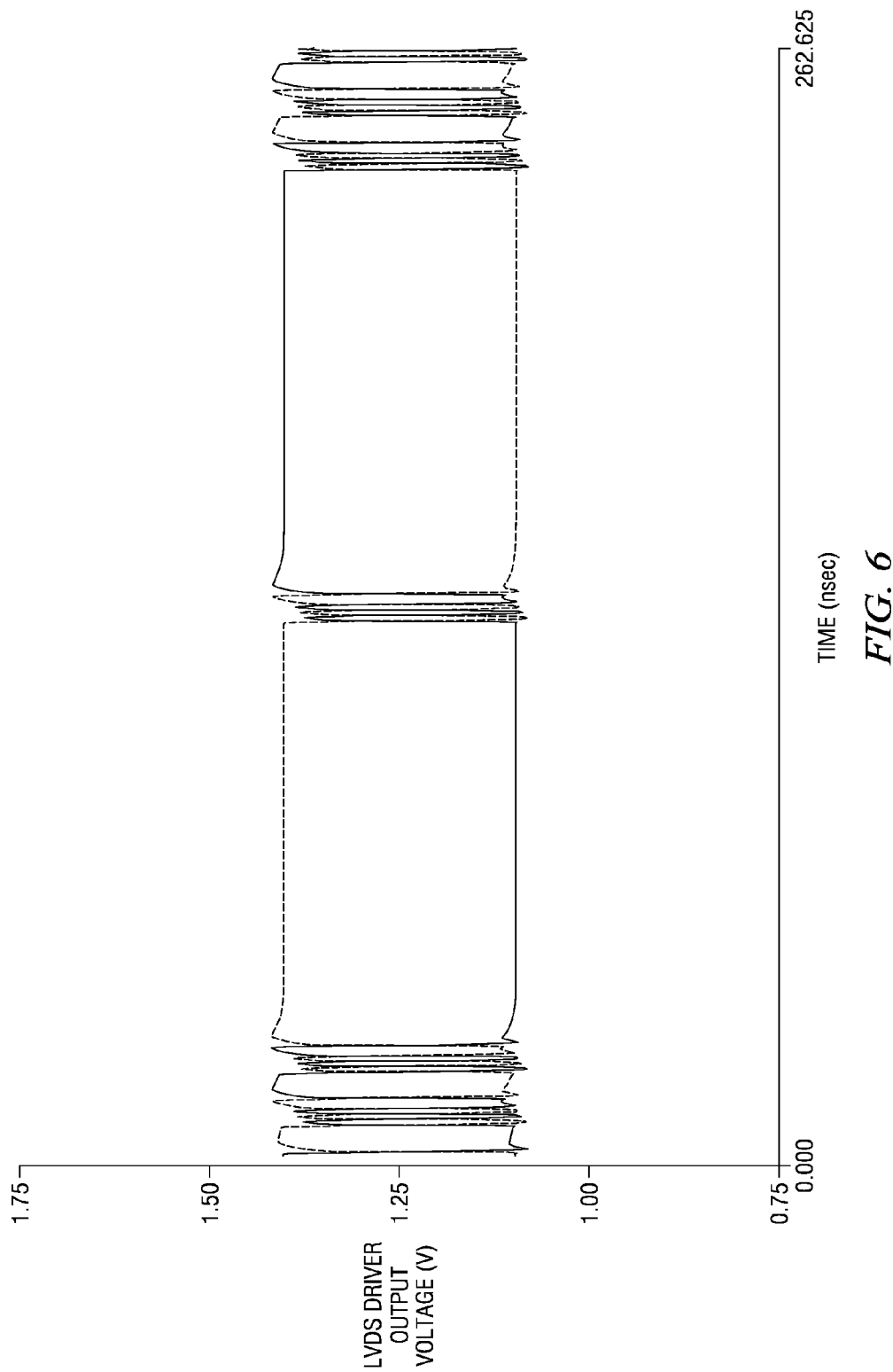
FIG. 6 shows the results of a circuit simulation of the example LVDS output driver.
Figure 7:
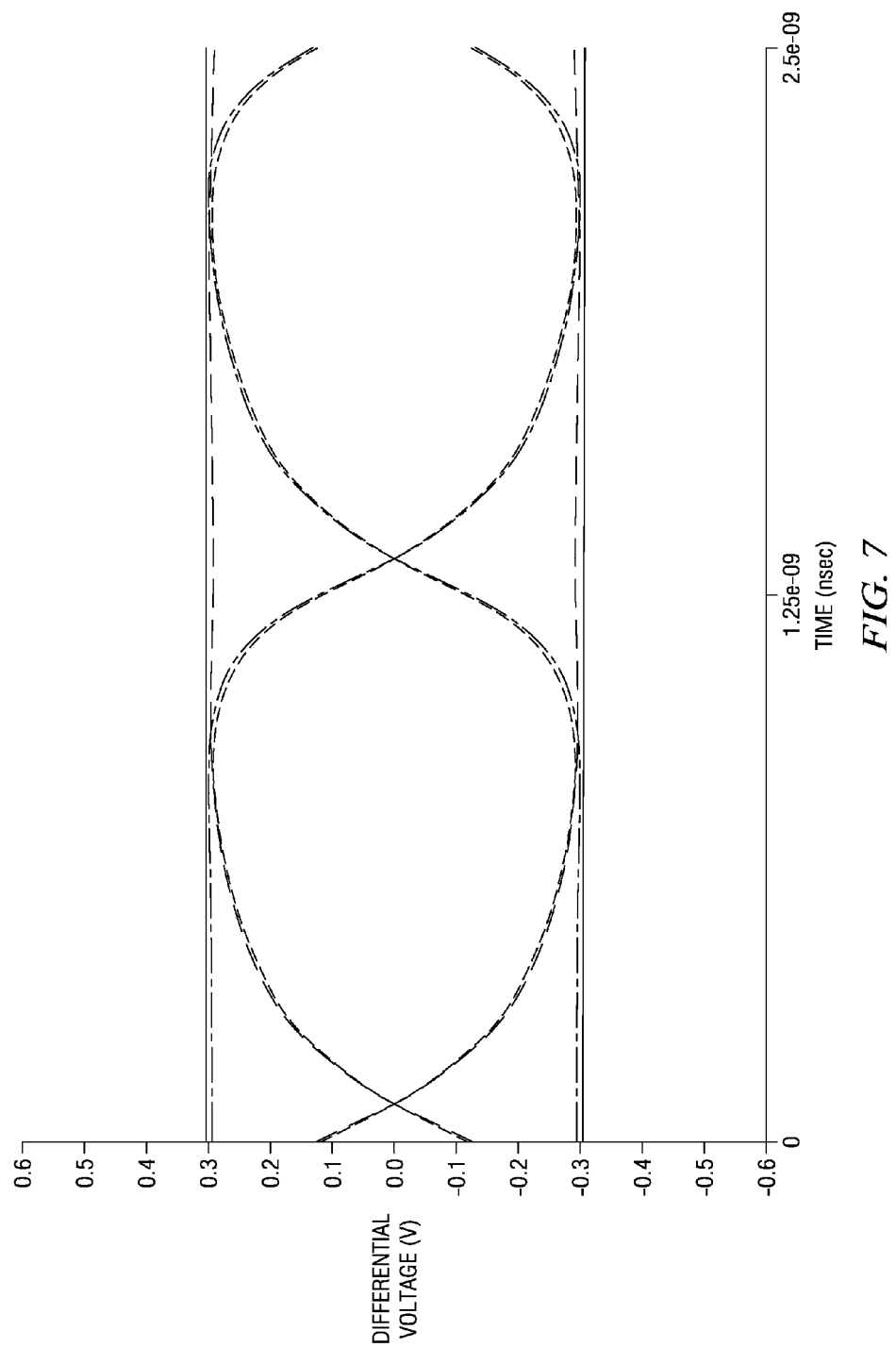
FIG. 7 shows the results of a circuit simulation of the example LVDS output driver.

FIGS. 6 & 7 show the results of a circuit simulation of the example LVDS output driver 500. FIG. 6 shows the output voltages at the output terminals, with a Vcc of 3.3V and with a common mode voltage centered at the desired level of 1.25V. FIG. 7 shows the corresponding differential eye diagram for the circuit simulation results shown in FIG. 6.

Although certain methods and apparatus have been described herein, the scope of coverage of this patent is not limited thereto. On the contrary, this patent covers all methods and apparatus fairly falling within the scope of the appended claims either literally or under the doctrine of equivalents.

What is claimed is:

1. A low voltage differential signaling driver circuit, the circuit comprising:
   a first differential pair of transistors;
   a pair of transconductances stages, wherein each stage includes:
      a current mirror having a pair of bipolar transistor; and
      a diode that is coupled between the collectors of the pair of bipolar transistors in the current mirror;
   a second differential pair of transistors that is coupled to the pair of transconductances stages;
   a first current source that is coupled to the first differential pair to provide current to the first differential pair of transistors;
   a second current source that is coupled to the second differential pair to provide current to the second differential pair of transistors;
   a pair of transresistance amplifiers that is coupled to the first differential pair and that is driven by the pair of transconductance stages; and
   an output port configured to have a common mode output voltage and a differential output voltage, wherein each of the common mode output voltage and the differential output voltage is based on a state of the first differential pair of transistors and the second differential pair of transistors.

2. A low voltage differential signaling driver circuit of claim 1, wherein the circuit further comprises a differential input that inputs a differential voltage to the first and second differential pairs.

3. A low voltage differential signaling driver circuit of claim 1, wherein the circuit further comprises a bias input configured to control the current sources.

4. A low voltage differential signaling driver circuit of claim 1, wherein the circuit further comprises a common mode feedback block controls the common mode output voltage.

5. A low voltage differential signaling driver circuit of claim 1, wherein the second current source and the second differential pair drives the transconductance stages.

6. A low voltage differential signaling driver circuit of claim 1, wherein each transresistance amplifier comprises an NPN bipolar transistor with feedback from a base to a collector provided by a resistor.

7. A low voltage differential signaling driver circuit of claim 6, wherein the resistor is configured to prevent the NPN transistor from entering saturation.

8. A low voltage differential signaling driver circuit of claim 1, wherein each transconductance stage further comprises a pair of NPN transistors configured as a current mirror, and each diode further comprises a Schottky diode.

9. A low voltage differential signaling driver circuit of claim 8, wherein each Schottky diode is configured to conduct current to prevent the transconductance stage transistors from entering saturation in response to a transresistance amplifier cutting off.

10. A low voltage differential signaling driver circuit of claim 8, wherein the current mirror of a transconductance stage coupled to the first transistor of the first differential pair is configured to sink current from a coupled transresistance amplifier based on the current flowing through the first transistor.

11. A low voltage differential signaling driver circuit of claim 8, wherein each Schottky diode is configured to allow current to bypass the current mirror in case of a cutoff condition in a transresistance amplifier coupled to the transconductance stage.

12. A low voltage differential signaling driver circuit of claim 1, wherein the transistors are configured to not enter saturation.

13. A low voltage differential signaling driver circuit the circuit comprising:
   a first differential pair of transistors;
   a pair of transconductances stages;
   a second differential pair of transistors that is coupled to the pair of transconductances stages;
   a first current source that is coupled to the first differential pair to provide current to the first differential pair of transistors;
   a second current source that is coupled to the second differential pair to provide current to the second differential pair of transistors;
   a pair of transresistance amplifiers that is coupled to the first differential pair and that is driven by the pair of transconductance stages;
   an output port configured to have a common mode output voltage and a differential output voltage, wherein each of the common mode output voltage and the differential output voltage is based on a state of the first differential pair of transistors and the second differential pair of transistors; and
   a protection transistors to conduct current into the transconductance stages to provide short-circuit protection.

14. A low voltage differential signaling driver circuit of claim 13, wherein the protection transistors are configured to conduct current into the transconductance stages in response to an increase in current to at least one of the transresistance amplifiers.

15. A low voltage differential signaling driver circuit, the circuit comprising:
   a first differential pair of PNP bipolar transistors and a second differential pair of PNP bipolar transistors, wherein each PNP bipolar transistor includes a base terminal coupled to a differential input and one PNP bipolar transistor of each pair is coupled to one terminal of the differential input;
   a first PNP current source including a base terminal coupled to a bias input voltage, an emitter terminal coupled to a power supply terminal, and a collector terminal coupled to the first differential pair of PNP bipolar transistors;
   a second PNP current source including a base terminal coupled to a bias input voltage, an emitter terminal coupled to a power supply terminal, and a collector terminal coupled to the first differential pair of PNP bipolar transistors;
   a pair of transresistance amplifiers, each transresistance amplifier comprising an NPN bipolar transistor and a resistor coupling a base terminal of the NPN bipolar transistor to a collector terminal of the NPN bipolar transistor, wherein one transresistance amplifier is coupled to one PNP bipolar transistor of the first differential pair at one terminal of a differential output and the second transresistance amplifier is coupled to the second PNP bipolar transistor of the first differential pair at the second terminal of the differential output;
   a pair of current mirrors, wherein one current mirror is coupled to one PNP bipolar transistor of the second differential pair and provides a current to the base terminal of the NPN bipolar transistor of one transresistance amplifier, and the second current mirror is coupled to the second PNP bipolar transistor of the second differential pair and provides a current to the base terminal of the NPN bipolar transistor of the second transresistance amplifier; and
   a common mode feedback block coupled to the differential output terminals and coupled to a first field effect transistor and a second field effect transistor, wherein the first field effect transistor is coupled between the first transresistance amplifier and a reference terminal, and the second field effect transistor is coupled between the second transresistance amplifier and the reference terminal.

16. An apparatus comprising:
   an input stage that receives a differential input signal; and
   a low voltage differential signaling output driver having:
      a first differential input transistor pair that is coupled to the input stage;
      a second differential input transistor pair that is coupled to the input stage;
      a first current mirror having a first terminal and a second terminal, wherein the first terminal of the first current mirror is coupled to a first transistor from the first differential input transistor pair;
      a first diode that is coupled between the first and second terminals of the first current mirror;
      a second current mirror having a first terminal and a second terminal, wherein the first terminal of the first current mirror is coupled to a second transistor from the first differential input transistor pair;
      a second diode that is coupled between the first and second terminals of the second current mirror;
      a first amplifier that is coupled to the second terminal of the first current mirror and to a first transistor from the second differential input transistor pair; and
      a second amplifier that is coupled to the second terminal of the second current mirror and a second transistor from the second differential input transistor pair.

17. The apparatus of claim 16, wherein the first amplifier further comprises:
   an NPN transistor that is coupled to the second terminal of the first current mirror at its base and to the first transistor from the second differential input transistor pair at its collector; and
   a resistor that is coupled between the base and collector of the NPN transistor.

18. The apparatus of claim 17, wherein the NPN transistor further comprises a first NPN transistor, and wherein the resistor further comprises a first resistor, and whrein the second amplifier further comprises:
   a second NPN transistor that is coupled to the second terminal of the second current mirror at its base and to the second transistor from the second differential input transistor pair at its collector; and
   a second resistor that is coupled between the base and collector of the second NPN transistor.

19. The apparatus of claim 18, wherein the apparatus further comprises:
   a first NMOS transistor that is coupled to the base of the first NPN transistor at its drain; and
   a second NMOS transistor that is coupled to the base of the second NPN transistor at its drain.

20. The apparatus of claim 19, wherein the apparatus further comprises a common mode feedback circuit that is coupled to the collectors of the first and second NPN transistors and to the gates of the first and second NMOS transistors.

21. The apparatus of claim 20, wherein the common mode feedback circuit further comprises:
   an impedance network that is coupled between the collectors of the first and second NPN transistors to measure a common mode voltage;
   a third differential input transistor pair that is coupled to the impedance network so as to receive the common mode voltage and that receives a desired common mode voltage; and
   a third current mirror is coupled to each transistor from the third differential input transistor pair and to the gates of the first and second NMOS transistors.

22. The apparatus of claim 16, wherein the first and second diodes further comprises a first Schottky diode and a second Schottky diode, respectively.

* * * * *